United States Patent
Qiu et al.

[11] Patent Number: 6,142,615
[45] Date of Patent: Nov. 7, 2000

[54] INK-JET RECORDING HEAD WITH PIEZOELECTRIC DEVICE AND METHOD FOR MANUFACTURING THE SAME

[75] Inventors: Hong Qiu; Soichi Moriya; Hiroyuki Kamei; Koji Sumi, all of Nagano, Japan

[73] Assignee: Seiko Epson Corporation, Tokyo, Japan

[21] Appl. No.: 09/047,432

[22] Filed: Mar. 25, 1998

[30] Foreign Application Priority Data

Mar. 25, 1997 [JP] Japan .................................. 9-072212
Aug. 28, 1997 [JP] Japan .................................. 9-232638
Feb. 27, 1998 [JP] Japan .................................. 10-047484

[51] Int. Cl.[7] .................................................. B41J 2/045
[52] U.S. Cl. .................................................. 347/70; 347/72
[58] Field of Search ................................... 347/70, 71, 72

[56] References Cited

U.S. PATENT DOCUMENTS 5,266,964  11/1993  Takahashi et al. ........................ 347/72
5,301,404   4/1994  Ochiai et al. ............................ 347/71
5,818,481  10/1998  Hotomi et al. ........................... 347/69

FOREIGN PATENT DOCUMENTS 0 408 306  1/1991  European Pat. Off. .

*Primary Examiner*—Joan Pendergrass
*Attorney, Agent, or Firm*—Sughrue, Mion, Zinn, Macpeak & Seas, PLLC

[57] ABSTRACT

A piezoelectric device for an ink jet print head that has a greater displacement at a low drive voltage. The ink-jet recording head includes a vibration plate, on which is mounted one or more piezoelectric devices that change the volumes of pressure chambers upon application of a voltage. The device is mounted at least on one face of a pressure chamber substrate that is to be filled with ink. Such piezoelectric device includes a second piezoelectric layer having a piezoelectric constant g of a constant value or higher; and a first piezoelectric layer having a dielectric constant of a specific value or higher. Since the piezoelectric constant d of the piezoelectric device correlates with the product of the largest piezoelectric constant g and the largest dielectric device of the piezoelectric devices, a piezoelectric constant d larger than in the conventional case, i.e., having a greater displacement, can be obtained.

22 Claims, 10 Drawing Sheets

100 INK-JET PRINTER

101 INK-JET RECORDING HEAD

INK-JET RECORDING HEAD WITH PIEZOELECTRIC DEVICE AND METHOD FOR MANUFACTURING THE SAME

FIELD OF THE INVENTION

The present invention relates to an ink-jet recording head operative to eject ink droplets through nozzles to perform printing on a recording medium, and in particular to an ink-jet recording head that includes a piezoelectric layer that can generate greater pressure in a pressure chamber in which ink is retained. The present invention also relates to a fabrication method for such ink jet recording head with a piezoelectric layer.

DESCRIPTION OF THE BACKGROUND ART

In an ink-jet recording head, a voltage applied to a piezoelectric device formed on a vibration plate causes a momentary change in the volume of a pressure chamber that communicates with nozzles and increases the pressure therein. The increased pressure causes ink droplets to be ejected from the nozzles and onto a recording medium.

For a conventional ink-jet printer, a piezoelectric ceramic layer made of lead zirconate titanate (PZT), for example, is formed on one face of a pressure chamber substrate to provide a piezoelectric device. Preferably, a polarized piezoelectric device is employed.

A desired improvement for the piezoelectric device used in an ink-jet printer is the capability to provide a greater displacement upon application of a smaller drive voltage. Physically, this characteristic can be quantified by using a value obtained from piezoelectric constant d, which is a product of piezoelectric constant g and a dielectric constant. The piezoelectric constant d is a factor of proportionality derived from a displacement and an electric field, and the piezoelectric constant g is a factor of proportionality between an electric field and stress. The dielectric constant is a factor of proportionality between the applied electric field and the density of a charge on a surface.

However, when an experiment is conducted while changing the composition of a piezoelectric ceramic material used to form a piezoelectric device in order to obtain the desired characteristic for an ink-jet recording head, it is difficult to obtain a single piezoelectric ceramic composition having a satisfactory piezoelectric constant d.

Accordingly, it is a first object of the present invention to provide an ink-jet recording head that has a laminated structure comprising piezoelectric ceramic layers having different characteristics, so that a piezoelectric device can be formed which has a higher piezoelectric constant d than a conventional device, thereby permitting more ink droplets to be ejected at a higher speed while applying a lower voltage.

It is a second objective of the present invention to provide a method, for manufacturing an ink-jet recording head, that comprises a step of laminating a plurality of piezoelectric ceramic layers having different characteristics, so that a piezoelectric device can be formed which has a higher piezoelectric constant d than a conventional device, thereby permitting more ink droplets to be ejected at a higher speed while applying a lower voltage.

It is a third objective of the present invention to provide a piezoelectric device that has a laminated structure comprising piezoelectric ceramic layers having different characteristics, and that, therefore, has a higher piezoelectric constant d than a conventional device.

SUMMARY OF THE INVENTION

In order to achieve the first object, according to the present invention, an ink-jet recording head has a vibration plate, on which is mounted a piezoelectric device that changes the volume of a pressure chamber by application of a voltage. The piezoelectric device is mounted on at least one face of a pressure chamber substrate that is to be filled with ink. The piezoelectric device comprises: a first piezoelectric layer having a dielectric constant of a specific value (e.g., 1400) or higher, and a second piezoelectric layer having a piezoelectric constant g of a constant value (e.g., $13 \times 10^{-3}$ m. V/N) or higher. Thus, when the piezoelectric layer laminate consisting of a plurality of layers is dielectrically polarized, the piezoelectric constant d as a whole corresponds to a product having a comparatively large piezoelectric constant g with a comparatively large dielectric constant between the layers, so that a piezoelectric device having a large piezoelectric constant d can be formed. In general, a "piezoelectric member" comprises a piezoelectric ceramic material and is a general term for metal compounds that cause dielectric polarization upon the application of force.

The first and the second piezoelectric layers are formed, for example, by laminating a plurality of layers that have the same composition.

The first piezoelectric layer is perovskite crystal, which has a composition represented by the general formula:

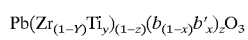

where b and b' denote divalent to hexavalent metal elements, and where element b has n valences (n is a natural number), b' has m valences, x is a real number of $0<x<1$, y is a real number of $0<y<1$, and z is a real number of $0<z<1$, with n, m and x satisfying the equation $$n(1-x)+mx=4.$$

According to this composition, the piezoelectric constant d is increased, and the voltage withstandability and the durability can be improved. The divalent to hexavalent metal elements b and b' consist of two of the following elements: Mg, Sc, Cr, Mn, Fe, Co, Ni, Zn, Nb, Cd, In, Sn, Sb, La, Yb, Lu, Ta, W and Bi. The first piezoelectric layer may have either one, or both of Zr and Ti. Specifically, the first piezoelectric layer has a composition of $Pb(Zr_{0.56}Ti_{0.44})_{0.8}(Mg_{1/3}Nb_{2/3})_{0.2}O_3$.

The second piezoelectric layer is a piezoelectric ceramic containing elements of Pb, Zr and Ti. Specifically, the second piezoelectric layer has a composition of $PbZr_{0.56}Ti_{0.44}O_3$.

When the first piezoelectric layer has piezoelectric constant g1 and the second piezoelectric layer has a piezoelectric constant g2 (g2>g1), it is preferable that the ratio of the thickness of the first piezoelectric layer to the thickness of the second piezoelectric layer be so adjusted as to obtain a desired piezoelectric constant g (g2>g>g1). According to the present invention, when the two piezoelectric layers are laminated, the piezoelectric constant g for the entire layer laminate is a value lying midway between the values for the piezoelectric constants g for the individual layers. Since the piezoelectric constant g of the layer lamination varies depending on the ratio of the thicknesses of the two piezoelectric layers, those thickness can be changed to obtain a desired piezoelectric constant g. For example, the piezoelectric constant g is adjusted so as to be 14 [mV·m/N]. This phenomenon will be discussed at a molecular structure level. When two piezoelectric layers having different compositions are formed while in contact with each other, both layers grow epitaxially and their perovskite structures are linked together. When great stress occur at one of the crystals, the other crystal is strained by this force, thereby acquiring a piezoelectric constant g that is greater than the stress that could occur at that crystal. Therefore, when different types of ceramic materials having similar crystal structures are laminated, the piezoelectric constant g differs from that when the piezoelectric ceramic materials are formed by using a single crystal. Since a piezoelectric layer having a small piezoelectric constant g is attracted by a piezoelectric layer having a large piezoelectric constant, in practice the piezoelectric constant g of the piezoelectric layer that has a small constant g is increased.

In addition, when the piezoelectric layer has a dielectric constant $\in 1$ and the piezoelectric layer has a dielectric constant $\in 2$ ($\in 1 > \in 2$), it is preferable that a ratio of the thickness of the first piezoelectric layer to the thickness of the second piezoelectric layer be so adjusted as to obtain a desired dielectric constant $\in$ ($\in 1 > \in > \in 2$). That is, when two piezoelectric layers having different dielectric constants are laminated, a permittivity characteristic is provided that is similar to that when capacitors are connected in series. The dielectric constant of the entire layer laminate is a value lying midway between the values for the dielectric constants of the individual layers. Since the dielectric constant of the layer lamination is varied depending on the ratio of the thicknesses of the piezoelectric layers, the thicknesses of the two layers can be adjusted to obtain a desired dielectric constant, e.g., 1400.

An ink-jet recording head according to the present invention may have a third piezoelectric layer that is composed of one or more types of layers and that has a different composition from that of the first and the second piezoelectric layers. In other words, the third piezoelectric layer includes a plurality of different types of layers. For example, the third piezoelectric layer is formed by combining the compositions of the first and the second piezoelectric layers.

As for the layer structure, the ink-jet recording head includes a plurality of the first and the second piezoelectric layers, and the first and the second piezoelectric layers are regularly laminated.

Further, the ink-jet recording head includes a plurality of the first, the second and the third piezoelectric layers, which consists of one or more types of layers, and the first, the second and the third piezoelectric layers may be regularly laminated.

The ink-jet recording head includes one or more of the first, the second and the third piezoelectric layers, and the first and the second, and the third piezoelectric layers may be irregularly laminated.

It is preferable that the piezoelectric device have an upper electrode and a lower electrode, which serves as a base for crystal growth, and that a piezoelectric layer that is closely attached to the lower electrode have a crystal particle that serves as the nucleus for the crystal growth. This is because when a crystal particle exists in the piezoelectric layer that is closely attached to the lower electrode, the crystal growth begins at the particle, and a piezoelectric layer having a preferable crystal condition can be formed.

To achieve the second objective, according to the present invention, there is a method for manufacturing an ink-jet recording head wherein a vibration plate, on which is mounted a piezoelectric device that changes the volume of a pressure chamber upon application of a voltage, is mounted on at least one face of a pressure chamber substrate that is to be filled with ink. The method comprises:

a vibration plate formation step of forming an insulating film and a lower electrode film on one face of the pressure chamber substrate;

a second piezoelectric layer formation step of forming a second piezoelectric layer having a second composition on the lower electrode film formed at the vibration plate formation step;

a first piezoelectric layer formation step of forming a first piezoelectric layer having a first composition on the second piezoelectric layer formed at the second piezoelectric layer formation step;

an upper electrode formation step of forming an upper electrode film on the first piezoelectric layer formed at the first piezoelectric layer formation step; and an etching step of etching the pressure chamber substrate on which the upper electrode film is formed at the upper electrode formation step to form a piezoelectric device.

Preferably, one of the first or the second piezoelectric layers that respectively have the first and the second compositions has a piezoelectric constant g equal to or larger than a constant value, and the other piezoelectric layer has a dielectric constant equal to or larger than a constant value.

It is preferable that the first piezoelectric layer formation step and the second piezoelectric formation step include: a coating step of coating a precursor for a piezoelectric layer; a drying step of drying the precursor of the piezoelectric layer coated at the coating step; a pyrolysis step of pyrolyzing the piezoelectric layer dried at the drying step; and a crystallization step of performing a high-speed thermal process for the piezoelectric layer pyrolyzed at the pyrolysis step. Further, it is preferable that a plurality of the piezoelectric layers that are dried and pyrolyzed be laminated by repeating the coating step, the drying step and the degreasing step a plurality of times. Since, through the drying, pyrolyzing and crystallizing process the individual piezoelectric layers are dielectrically polarized in a specific direction and the amorphous state is eliminated, the difference in composition among the piezoelectric layers having the first and the second compositions can be reduced. That is, when different types of amorphous piezoelectric layers are laminated, a diffusion phenomenon tends to occur and the differences in the compositions tend to be eliminated. If a plurality of layers are sorted into a plurality of layer groups and are then dried, pyrolyzed, and crystallized, the diffusion phenomenon occurs less frequently and the differences in the compositions can be maintained as the original ceramic composition.

According to the present invention, the method further comprises:

a pressure chamber formation step of forming a pressure chamber on the other face of the pressure chamber substrate; and a nozzle plate formation step of forming a nozzle plate on a face of the pressure chamber substrate opposite to the face on which a pressure chamber is formed at the pressure chamber formation step.

DESCRIPTION OF THE PREFERRED EMBODIMENTS

The several embodiments of the present invention are described herein with reference to the drawings.

EMBODIMENT 1

Figure 2:
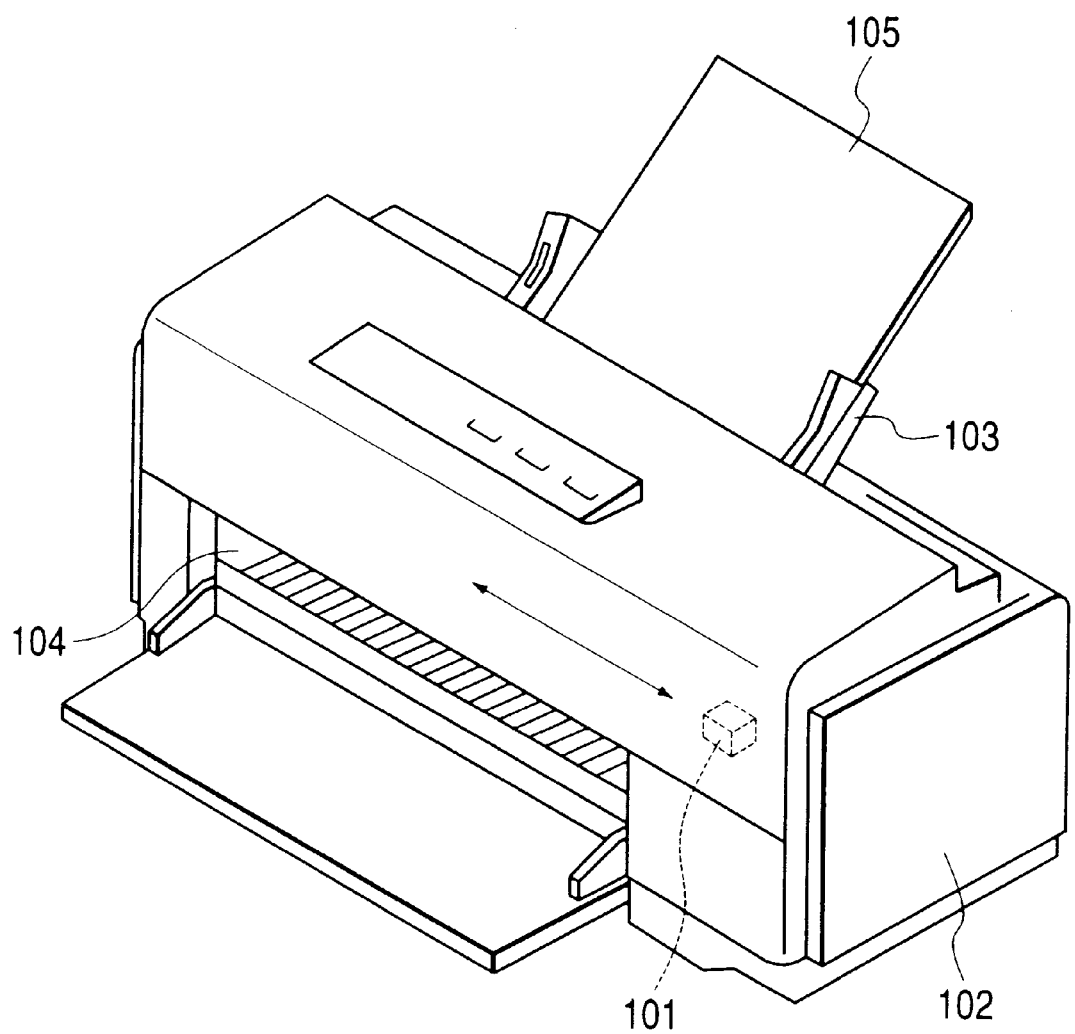
FIG. 2 illustrates a perspective view of an ink-jet printer that uses the present invention.

First, an explanation will be given for the structure of an ink-jet printer in which an ink-jet recording head according to the present invention is employed. As is shown in FIG. 2, an ink-jet printer 100 that is pertinent to the present invention comprises an ink-jet recording head 101 of the present invention, a main body 102 and a tray 103. When a sheet 105 is fed, the ink-jet recording head 101 is driven in a direction indicated by an arrow, and ejects ink droplets through its nozzles 11 (see FIG. 3) onto the sheet 105 to enable printing. The main body 102, which includes the tray 103, holds internally the ink-jet recording head 101 that is to be driven. When print data are transmitted from a computer (not shown), the sheet 105 fed along the tray 103 is delivered to a discharge port 104. The tray 103 is so designed that a sheet 105 which is mounted on it is supplied to the interior of the main body 102.

Figure 3:
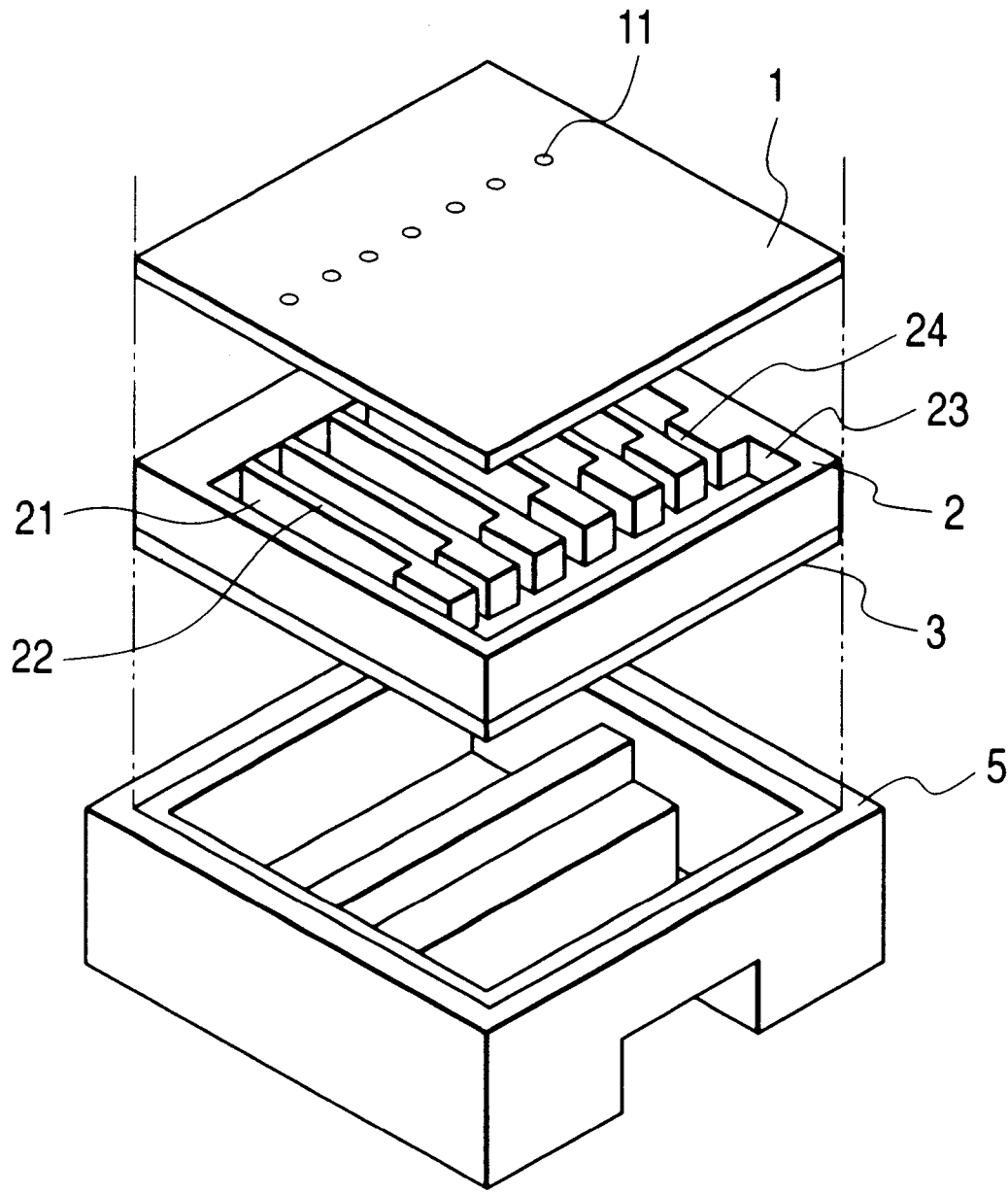
FIG. 3 illustrates an exploded perspective view of an ink-jet recording head according to the present invention.

As is shown in FIG. 3, the ink-jet recording head 101 is constituted by a nozzle plate 1, a pressure chamber substrate 2, a vibration plate 3 and a housing 5.

The nozzle plate 1 is attached to the pressure chamber substrate 2, so that nozzles are located at positions corresponding to those of a plurality of cavities (pressure chambers) 21 formed on the pressure chamber substrate 2.

The pressure chamber substrate 2 includes the cavities 21, side walls 22, a reservoir 23 and supply ports 24. The cavities 21 are formed by etching the substrate, which is made of silicon, the side walls 22 serve as partitions for the cavities 21, and the reservoir 23 serves as a flowpath used in common along which ink can be supplied after the cavities 21 are filled with ink. The supply ports 24 are so formed that ink can be introduced along them to the cavities 21.

The housing 5 is made of a resin or metal to hold the pressure chamber substrate 2, to which the nozzle plate 1 and the vibration plate 3 are attached. Ink is supplied to the housing 5 from an ink tank (not shown) and to the pressure chamber substrate 2 through an ink tank port 33 shown in FIG. 4.

Figure 4:
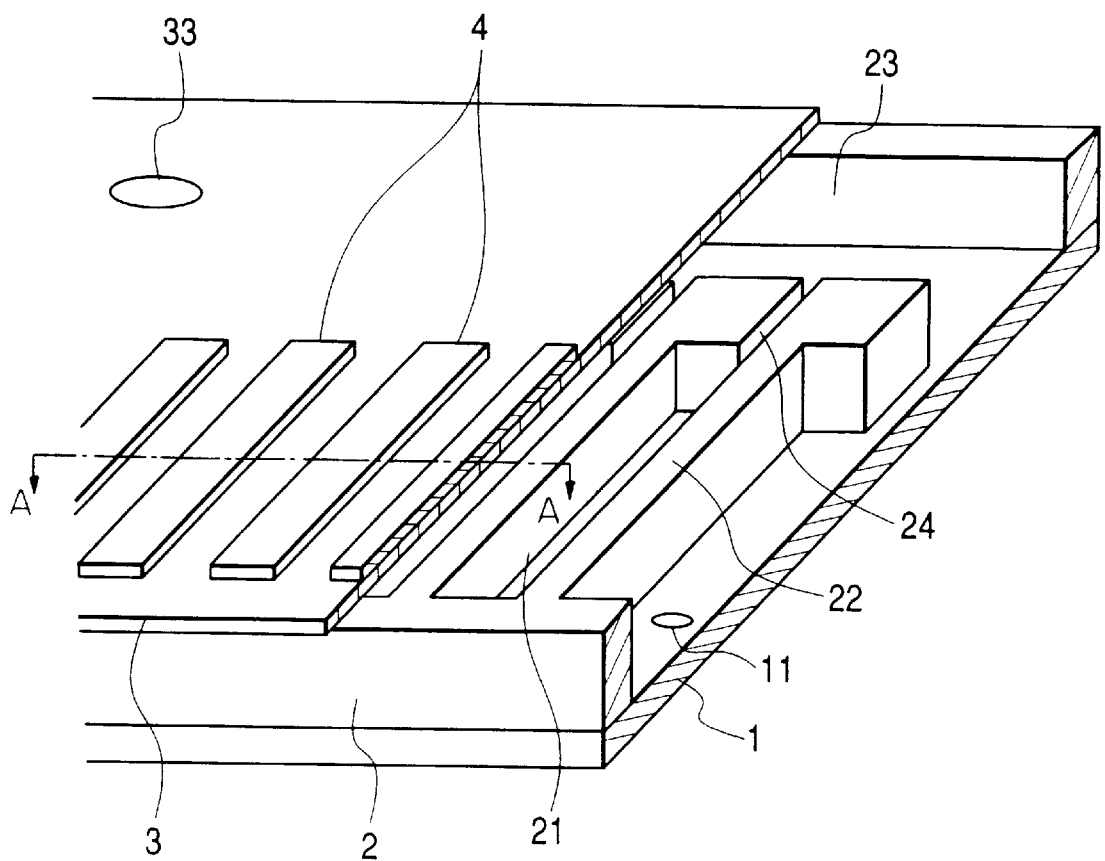
FIG. 4 illustrates a partial cross-sectional, perspective view of a pressure chamber substrate of an ink-jet recording head according to the present invention.

The vibration plate 3 can be attached to one face of the pressure chamber substrate 2, as is shown in FIG. 4. Piezoelectric devices 4 having a predetermined shape are formed on the vibration plate 3.

Figure 1:
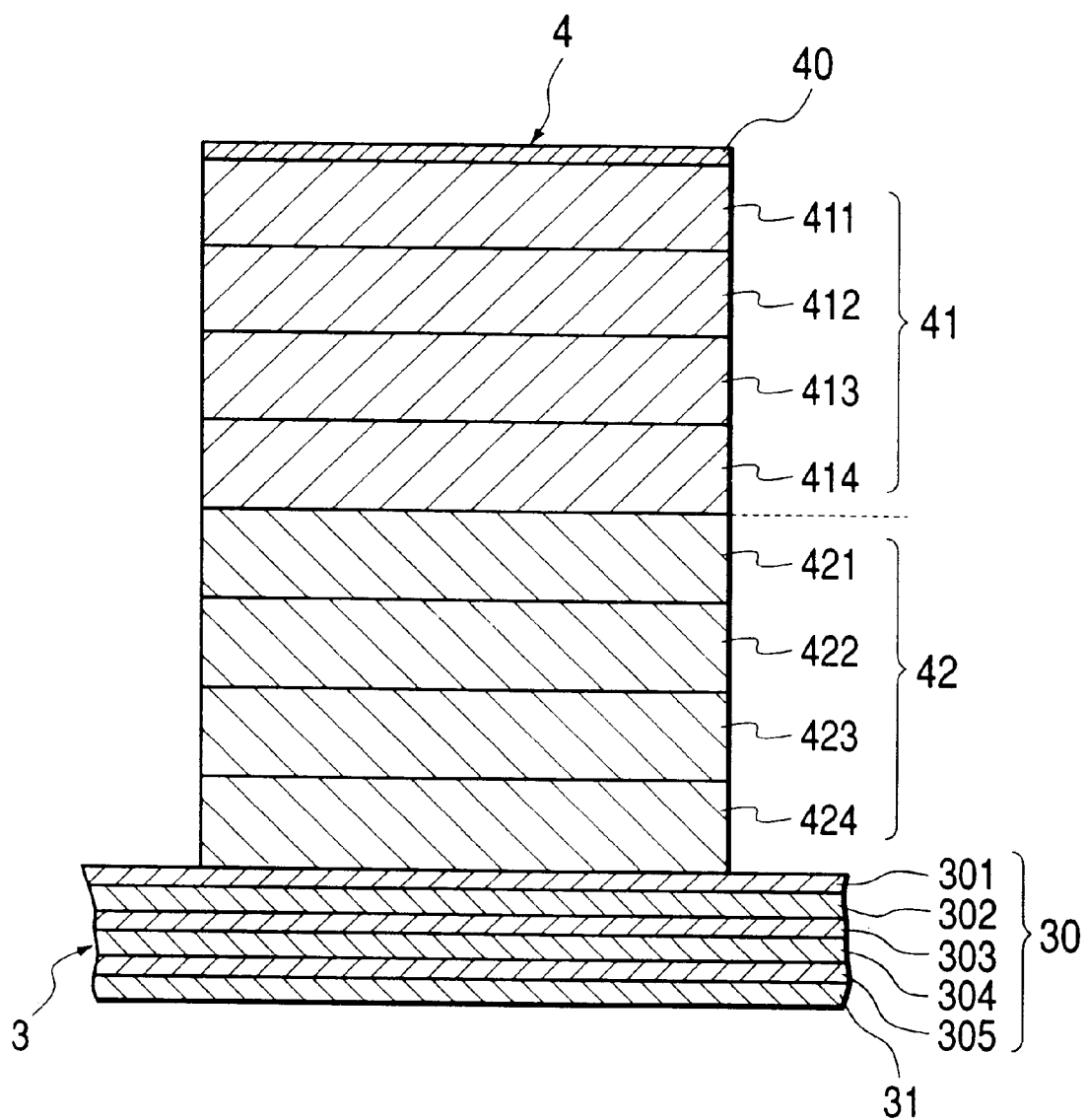
FIG. 1 illustrates a cross-sectional view of the layer structure of a piezoelectric device according to Embodiment 1, as viewed at a cross section taken along A—A in FIG. 4.

Specifically, as is shown in FIG. 1, the layer structure of the vibration plate 3 and the piezoelectric devices 4 (cross section taken along A—A in FIG. 4) includes an upper electrode film 40 as a piezoelectric device 4, a first piezoelectric layer 41, a second piezoelectric layer 42, a lower electrode film 30, which serves as the vibration plate 3, and an insulating film 31.

The upper electrode film 40 serves as an electrode for applying a voltage to the piezoelectric layer, and is made of a conductive material, such as platinum (Pt), 0.1 $\mu$m thick.

The first piezoelectric layer 41 is constituted by a plurality of layers, e.g., four ceramic layers 411 to 414. The individual ceramic layers are polarized by being individually dried and pyrolyzed. The ceramic layers 411 to 414 are composed of a piezoelectric ceramic composition that has a comparatively large dielectric constant. Specifically, it is preferable that the first piezoelectric layer 41 be a perovskite structure crystal that is represented by the general formula:

$$Pb(Zr_{(1-y)}Ti_y)_{(1-z)}(b_{(1-x)}b'_x)_z O_3 \qquad (1),$$

where b and b' are divalent to hexavalent metal elements, and x is a real number of 0<x<1, y is a real number of 0<y<1 and z is a real number of 0<z<1. When element b has n valances (n is a natural number) and b' has m valances, n and m are so adjusted as to satisfy the following equation:

$$n(1-x)+mx=4 \qquad (2)$$

Equation (2) means that the elements are electrically neutral. The divalent to hexavalent metal elements are, for example, Mg, Sc, Cr, Mn, Fe, Co, Ni, Zn, Nb, Cd, In, Sn, Sb, La, Yb, Lu, Ta, W and Bi. The composition as it relates to b and b, of the first piezoelectric layer 41 is, for example, $Pb(Ni_{1/3}Nb_{2/3})O_3$, $Pb(Mg_{1/3}Ta_{2/3})O_3$, $Pb(Zn_{1/3}Nb_{2/3})O_3$, $Pb(Co_{1/3}Nb_{2/3})O_3$, $Pb(Mn_{1/2}W_{1/2})O_3$, $Pb(Zn_{1/2}W_{1/2})O_3$, $Pb(Mg_{1/2}W_{1/2})O_3$, $Pb(Co_{1/2}W_{1/2})O_3$, $Pb(Ni_{1/2}W_{1/2})O_3$ or $Pb(Fe_{2/3}W_{1/3})O_3$. The typical composition, of the first piezoelectric layer, that exhibits a preferable piezoelectric characteristic is $Pb(Zr_{0.56}Ti_{0.44})_{0.8}(Mg_{1/3}Nb_{2/3})_{0.2}O_3$.

Since Mg tends to be comparatively easily diffused in the direction of the depth (thickness) and deteriorates the voltage withstandability of the piezoelectric device, the composition for the first piezoelectric layer may not include Mg. With the above described composition of the first piezoelectric layer, the dielectric constant ∈, which is proportional to the piezoelectric characteristic d, is increased, so that the piezoelectric characteristic d is enhanced. When Mg, which tends to be diffused in the direction of the depth, is not employed, the third element is distributed more uniformly in the direction of the depth, so that the voltage withstandability and the durability of the piezoelectric layer are improved.

During the manufacturing process for the piezoelectric layer, the piezoelectric ceramic (hereinafter referred to as a "precursor") immediately after it is coated is amorphous, and an element diffusion phenomenon occurs on a face that contacts another composition (e.g., the second piezoelectric layer). In this embodiment, however, since the second piezoelectric layer 421 has been dried, pyrolyzed and crystallized, and a ceramic layer 414b has also been crystallized as the result of a drying and pyrolyzing process after it was coated, a diffusion phenomenon rarely occurs between the precursor and the second piezoelectric layer. Therefore, the compositions of at least the ceramic layers 411 to 413 are maintained as they have been coated.

The second piezoelectric layer 42 consists of a plurality of layers, e.g., four ceramic layers 421 to 424. The individual ceramic layers are crystallized by drying and pyrolyzing each layer as it is formed. The ceramic layers 421 to 424 have a piezoelectric ceramic composition that has a comparatively high piezoelectric constant g. Such a composition is, for example, the one containing an oxide (PZT: lead zirconate titanate) of lead (Pb), zirconium (Zr) and titanium (Ti). A specific composition for the second piezoelectric layer is $PbZr_{0.56}Ti_{0.44}O_3$.

During the manufacturing process for the piezoelectric layer, a ceramic layer precursor 422b in the second piezoelectric layer 42 is amorphous immediately after it is coated, and an element diffusion phenomenon occurs on a face that contacts another composition (e.g., a titanium layer 301 in the lower electrode film 30). However, since the ceramic layer 424b that is coated is dried, pyrolyzed and crystallized, a diffusion phenomenon rarely occurs between the precursor 424b and the composition of the lower electrode film 30. Therefore, the compositions at least of the ceramic layers 421 to 423 are maintained as they have been coated. The piezoelectric layer 424 that directly contacts the lower electrode film 30 is a layer wherein crystal first grows. It is preferable that a crystal nucleus be included in the piezoelectric film precursor that is applied for the formation of the piezoelectric layer. When the crystal nucleus exists in a layer that contacts the lower electrode film, the perovskite structure grows from the phase boundary of the crystal nucleus. In a piezoelectric layer that does not contact the lower electrode film, the crystal growth continues in consonance with the crystal structure of a piezoelectric layer with which in contact. That is, it is preferable that a crystal nucleus exist in a layer at least that contacts the lower electrode film in order to form a piezoelectric device having a satisfactory crystal structure.

The first piezoelectric layer 41 and the second piezoelectric layer 42 may be laminated in the reverse order. Specifically, the first piezoelectric layer 41 may be formed on the lower electrode film 30, the second piezoelectric layer 42 may be formed thereon, and then the upper electrode film 40 may be formed thereon.

These piezoelectric layers may be constituted by either more than or fewer than four layers. It should be noted that when too many layers are laminated, the drive voltage will be raised and the advantage of the present invention will be lost. When there are too few layers laminated, the uniformity of the compositions due to the diffusion phenomenon is accelerated between the two piezoelectric layers, so that the resultant structure of the piezoelectric device would be the same as that consisting of a single composition, and an increase in the piezoelectric constant d could not be expected. Further, if each ceramic layer is too thick, the thickness of the entire layer lamination is increased accordingly, and a higher drive voltage will be required. On the contrary, if each ceramic layer is formed too thin, the thicknesses of the layers will not be uniform, so that the characteristics of the individual piezoelectric devices that are separated by etching will be varied, the number of fabrication steps will be increased and the manufacturing costs will be raised. Thus, preferably, two to six ceramic layers are laminated for each piezoelectric layer, and more preferably, four layers. It is preferable that the thickness of each ceramic layer be 80 nm to 200 nm, and more preferably, 125 nm.

The ceramic layers constituting each piezoelectric layer need not have the same thickness. For example, only layers (414 and 424) that contact other compositions may be formed thin; the other layers may be thick. In this manner, the thickness of the layer through which the diffusion of compositions will occur can be reduced.

The lower electrode film 30 is paired with the upper electrode film 40 to apply a voltage to the piezoelectric layers, and is formed by laminating conductive materials, such as a titanium (Ti) layer 301, a platinum (Pt) layer 302 and a titanium (Ti) layer 303. Further, in order to improve the contact between the lower electrode film 30, which includes the titanium layer 301, the platinum layer 302 and the titanium layer 303, and the insulating film 31, a titanium oxide layer 304 and a titanium layer 305 are inserted between the lower electrode film 30 and the insulating film 31.

The insulating film 31 is made of non-conductive material, such as silicon dioxide, which is formed by thermal oxidation of a silicon substrate. The insulating film 31 can be deformed, as the piezoelectric layer is displaced in the direction of thickness and the perpendicular direction, and momentarily increases the pressure inside the cavities 21.

A piezoelectric constant d is provided as an index for the characteristic of a piezoelectric device, and is represented by the unit C/N, i.e., by the quantity of electric charges that are generated upon the application of a pressure of 1 newton. The piezoelectric constant d correlates with a product of piezoelectric constant g, which is a factor of proportionality derived from an electric field and stress, and a dielectric constant, which is a factor of proportionality derived from an electric field and a face charge density.

When laminated ceramic layers are a piezoelectric layer that has the first piezoelectric constant g1 and the first dielectric constant $\in_1$, and a piezoelectric layer that has the second piezoelectric constant $g_2(g_1<g_2)$ and the second dielectric constant $\in_2$ ($\in_1>\in_2$), the piezoelectric constant d in the direction of the thickness of the two layers is represented as:

$$d = g \times \in \times \in_0 \qquad (3).$$

where $g_1<g\leq g_2$, $\in_2<\in\leq\in_1$, and $\in_0$ is dielectric constant in vacuum (=$8.85\times10^{-12}$ [F/m]). That is, when a plurality of piezoelectric layers are laminated, the piezoelectric constant d of the entire structure is proportional to the product of the relatively large piezoelectric constant g and the relatively large dielectric constant. This is because the structure of the piezoelectric device can be analyzed by using a capacitor arrangement model and a mechanical arrangement model. The piezoelectric constant d when the piezoelectric constants g of the two layers differ can be understood through observation of the atomic structure. When piezoelectric layers having different compositions are formed in contact, crystal of one of the piezoelectric layer epitaxially grows and this growth is transmitted to the other piezoelectric layer. When the boundary of the two layers is photographed using high-resolution cross-section TEM (Transmission Electron Microscopy), it is found that lattices of atoms extend across the boundary between the two layers. That is, the elements of the two layers grow epitaxially, and at the atomic level the crystal structure is continuous between the second piezoelectric layer and the first piezoelectric layer, without any defect occurring in the film structure. The change in the crystal structure of one piezoelectric layer affects the other piezoelectric layer; when greater stress occurs in one crystal, it affects the other crystal, resulting in a piezoelectric constant that is larger than the stress that could occur with only the other crystal. Therefore, when different kinds of ceramic layers having a similar crystal structure are laminated, a piezoelectric constant g is obtained that differs from that obtained when the piezoelectric ceramic material is formed of single crystal. Since the piezoelectric layer that has the small piezoelectric constant g is affected by the piezoelectric layer having the large constant g, the piezoelectric constant g at the piezoelectric layer having the small constant g can be increased.

Through observation of the piezoelectric layers with respect to the connection relationship of capacitors, it is easy to understand what value the dielectric constant of the piezoelectric device can be when the two piezoelectric layers have different dielectric constants. Compared, as a capacitor, with a piezoelectric device that has a single piezoelectric layer capacitor, a piezoelectric device that is a laminate of two piezoelectric layers having different dielectric constants has a dielectric characteristic that is similar to that obtained by a series connection of capacitors that have different dielectric constants and have a smaller gap than a gap at single type of layers. The dielectric constant of the total piezoelectric layer is a value lying midway between the values of the dielectric constants of the two piezoelectric layers. In other words, the dielectric constant of the entire device can be increased by laminating layers having large dielectric constants.

In this embodiment, since the second piezoelectric layer 42 is formed of PZT, its piezoelectric constant g is large. The first piezoelectric layer 41 which contains magnesium (Mg) and niobium (Nb) in addition to PZT has a slightly smaller piezoelectric constant g and a larger dielectric constant than has the second piezoelectric layer 42. When the first piezoelectric layer 41 and the second piezoelectric layer 42 are laminated, according to equation (3) the obtained piezoelectric constant d is higher than is that of a piezoelectric device constituted by either piezoelectric layer alone. Therefore, the piezoelectric device in this embodiment has a larger piezoelectric constant d than has a conventional piezoelectric device composed of one composition, and is displaced more upon the application of the same voltage as is the conventional device.

Figure 5:
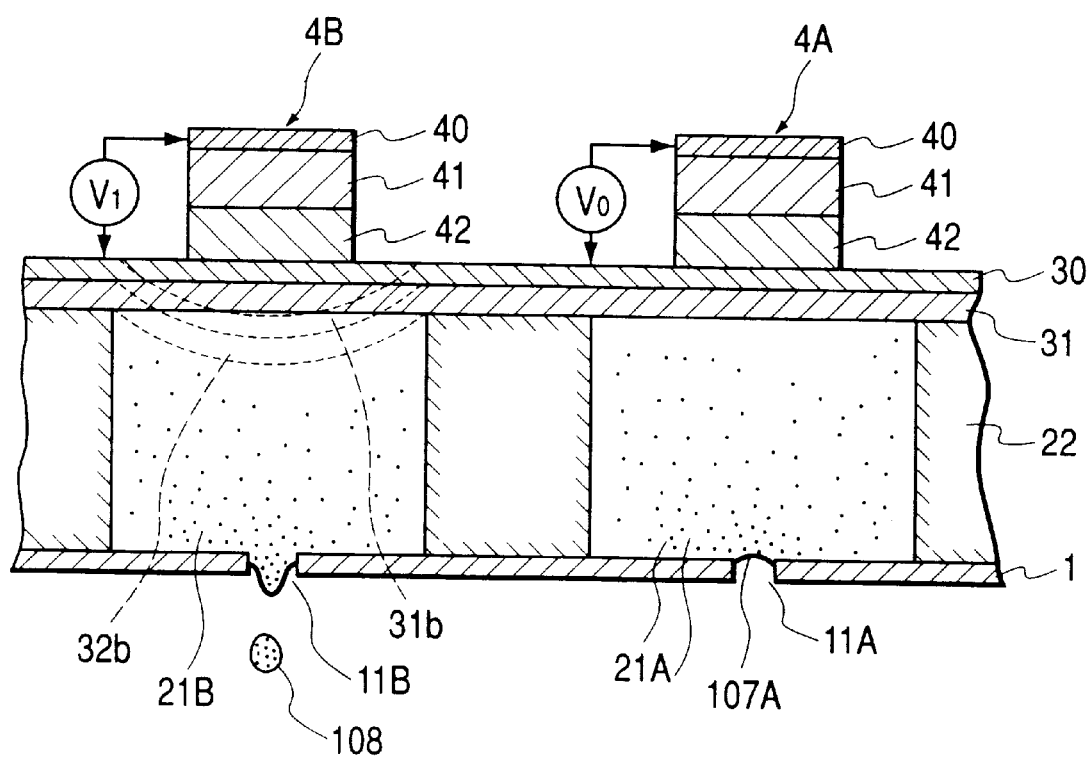
FIG. 5 illustrates a cross-sectional view for explaining an operating principle for an ink-jet recording head according to the present invention, as viewed at a cross-section taken along A—A in FIG. 4.

The principle on which the ejection of ink droplets is based will now be described. FIG. 5 is a cross-sectional view of two cavities of the ink-jet recording head according to the present invention. A voltage V0 is applied to a piezoelectric device 4A corresponding to a cavity 21A, and a voltage V1 is applied to a piezoelectric device 4B corresponding to a cavity 21B. The voltage V0 is a voltage level (e.g., 0 V) at which there is no displacement of the piezoelectric device, and the voltage V1 is a voltage level (e.g., 15 V) at which there is a displacement of the piezoelectric device.

Since there is no displacement of the piezoelectric device 4A to which the voltage V0 is applied, the pressure in the cavity 21A is not changed. Only an ink meniscus 107A is formed at a nozzle 11A; no ink droplets are ejected.

There is a large displacement of the piezoelectric device 4B to which the voltage V1 is applied because of its structure: a laminate composed of a plurality of piezoelectric layers. The lower electrode film 30 and the insulating film 31 are deformed to the locations indicated by broken lines 32b and 31b in FIG. 5 and the volume inside the cavity 21B is reduced. Thus, the pressure in the cavity 21B is increased momentarily and an ink droplet 108 is ejected through a nozzle 11B.

A method for manufacturing an ink-jet recording head according to the present invention comprising steps for each pertinent structure, will now be described.

Vibration plate formation step (FIG. 6(a)): First, an insulating film 31 and a lower electrode 30, which serve as vibration plate films 3, are formed on a silicon substrate 20. The silicon substrate 20 is thermally oxidized in a dry oxygen atmosphere for 22 hours in a furnace at 1100° C., and in this manner a thermal oxide film of approximately 1 μm thick is formed as the insulating film 31 on the silicon substrate 20. Or the silicon substrate 20 may be thermally oxidized in an oxygen and water vapor atmosphere for five hours to form the approximately 1 μm thick thermal oxide film. The insulating film 31 obtained by either of these methods is used both for electric insulation and also as a protective layer for an etching process.

For the formation of the lower electrode film 30, for example, a titanium layer 305 of approximately 20 nm, a titanium oxide layer 304 of approximately 20 nm, a titanium layer 303 of approximately 5 nm, a platinum layer 302 of approximately 500 nm and a titanium layer 301 of approximately 5 nm are laminated sequentially employing the direct current sputtering method. A platinum layer approximately 800 nm thick may be formed by using the sputtering method. It should be noted that the titanium layer 303 under the platinum layer 302 is necessary.

Second piezoelectric layer formation step (FIG. 6(b) and (c)): The second piezoelectric layer 42 is formed.

i) Coating step (FIG. 6(b)) Spin coating is used to coat the lower electrode 30 with a piezoelectric ceramic (e.g., lead zirconate titanate) which has a piezoelectric constant g equal to or larger than a speciftied value, or with a material containing a solid solution of the piezoelectric ceramic as a primary element. When four layers are to be laminated, as in this embodiment, the thickness of each layer should be approximately 125 nm. To obtain a uniform thickness for each layer, a rotary table for spin coating is rotated first at a low speed (e.g., at 500 r.p.m for 30 seconds), then at a high speed (e.g., 1500 r.p.m for 30 seconds), and finally at a low speed again (e.g., 500 r.p.m for 10 seconds).

Immediately after the coating of the material, a diffusion a phenomenon occurs at the surf ace boundary between the ceramic layer and the lower electrode film. However, this phenomenon will cease when the ceramic layer 424 is crystallized at the following drying and pyrolyzing step.

ii) Drying and pyrolyzing step (FIG. 6(c)): Immediately after being applied the ceramic layer 424b is a piezo electric film precursor in the amorphous state, and is not yet crystallized. Therefore, after the application of the ceramic layer 424b, the resultant structure is dried at a specific temperature (e.g. 180 degrees) for a specific period of time (e.g., 10 minutes) in order to vaporize organic solvents. After being dried, the structure is then pyrolyzed at a specific high temperature (e.g, 400 degrees) for a specific period of time (30 minutes). The organic ligand that is coordinated in metal elements contained in the piezoelectric layer precursor is thermally decomposed, and the metal elements are oxidized to form a metal oxide. At this step, the ceramic layer 424b, a precursor, is changed to the ceramic layer 424.

When the ceramic layer 424 is acquired through the drying and pyrolyzing process, the above steps i) and ii) are repeated to form a ceramic layer 423 on the ceramic layer 424, and the steps i) and ii) are repeated two more times to form ceramic layers 422 and 421. The coating, drying and pyrolyzing steps are repeated at predetermined number of times, e.g., four times. In the drying and pyrolyzing process, metal alkoxide is hydrolyzed or polycondensated, thereby forming a metal-oxygen-metal network.

When the four ceramic layers are laminated, the lamination is thermally processed in a specific atmosphere. For example, in an oxygen atmosphere, the laminate is heated for five minutes at 600° C. and further for one minute at 725° C. during a rapid thermal annealing process (RTA). Through this thermal process, crystallization of the gel in the amorphous state to obtain a perovskite structure is accelerated, and the characteristic of the piezoelectric device is increased.

First piezoelectric layer formation step (FIG. 6(d) and (e)): A first piezoelectric layer 41 is formed on the second piezoelectric layer 42 formed at the above step.

i) Coating step (FIG. 6(d)): As well as in the first ceramic layer formation, the second piezoelectric layer 42 is coated, using spin coating, with a piezoelectric ceramic material (oxide of Pb, Zr, Ti, Mg and Nb), which has a dielectric constant equal to or larger than a specific value, or its solid solution. The coating conditions and the thickness are the same as in the first ceramic layer formation step.

ii) Drying and degreasing step (FIG. 6(e)): After the precursor 414b of the first ceramic layer is applied, the drying and degreasing process is performed in the same manner and under the same conditions as in the first ceramic layer formation step. After the ceramic layer 414 is formed, the ceramic layers 413 and 411 are laminated thereon in the same manner as in the first ceramic layer formation step.

When the four ceramic layers are laminated, the resultant structure is thermally processed at a predetermined atmosphere to accelerate the crystallization of the ceramic layers and to enhance the characteristic of the piezoelectric layer. For example, in an oxygen atmosphere, the laminated structure is heated for five minutes at 650° C. and then for one minute at 900° C. during the rapid thermal annealing process (RTA) using oxygen. As a result, a piezoelectric device is provided that is 1000 nm thick and has eight laminated layers.

Upper electrode formation step (FIG. 6(f)): An upper electrode film 40 is formed on the first piezoelectric layer 41 using either the electron beam vacuum evaporation method or the sputtering method. Aluminum or platinum is used as the upper electrode material, and the thickness of the material is approximately 100 nm. h Etching step (FIG. 6(g)): After the individual layers have been formed, the laminated structure on the vibration plate film 3 is masked to correspond to the shapes of the cavities, and etching of the surrounding surface is performed to remove the upper electrode film and the piezoelectric layers. That is, a resist layer having a uniform thickness is applied to the laminated structure using either the spinner method or the spray method, and the resultant structure is exposed and developed to form the resist layer on the upper electrode film 40. Then, unnecessary portions of the layer are removed either by ion-milling or by dry etching, which is the procedure that is normally employed. As a result, by following the above described steps, piezoelectric devices can be provided.

Pressure chamber formation and nozzle plate installation step (FIG. 6(h)): A cavity 21 is formed in the other face of the pressure chamber substrate 2. The etching to provide the cavity space is performed, for example, by anisotropic etching, using an active gas, such as parallel-plate reactive ion etching. The portions remaining after the etching is completed serve as side walls 22. Nozzle plates 1 are aligned and bonded, using resin, to the pressure chamber substrate 2 that has been etched, so that the positions of the nozzles 11 correspond to the locations of the cavities 21 in the pressure chamber substrate 2. The pressure chamber substrate 2 to which the nozzle plates 1 are bonded is attached to the housing 5. In this fashion, the ink-jet recording head 101 can be completed.

EXAMPLE 1

The ink-jet recording head 101 was acquired by employing the above described manufacturing method. $Pb(Zr_{0.56}Ti_{0.44})_{0.8}(Mg_{1/3}Nb_{2/3})_{0.2}O_3$ was employed as the composition for the first piezoelectric layer, and $PbZr_{0.56}Ti_{0.44}O_3$ was employed as the composition for the second piezoelectric layer. When the number of ions of individual elements (Pb, Zr, Ti, Mg, Nb, O, Pt and Si) were measured relative to the piezoelectric layer depth of the ink-jet recording head in this example, they were changed as is shown in FIG. 7.

Figure 7:
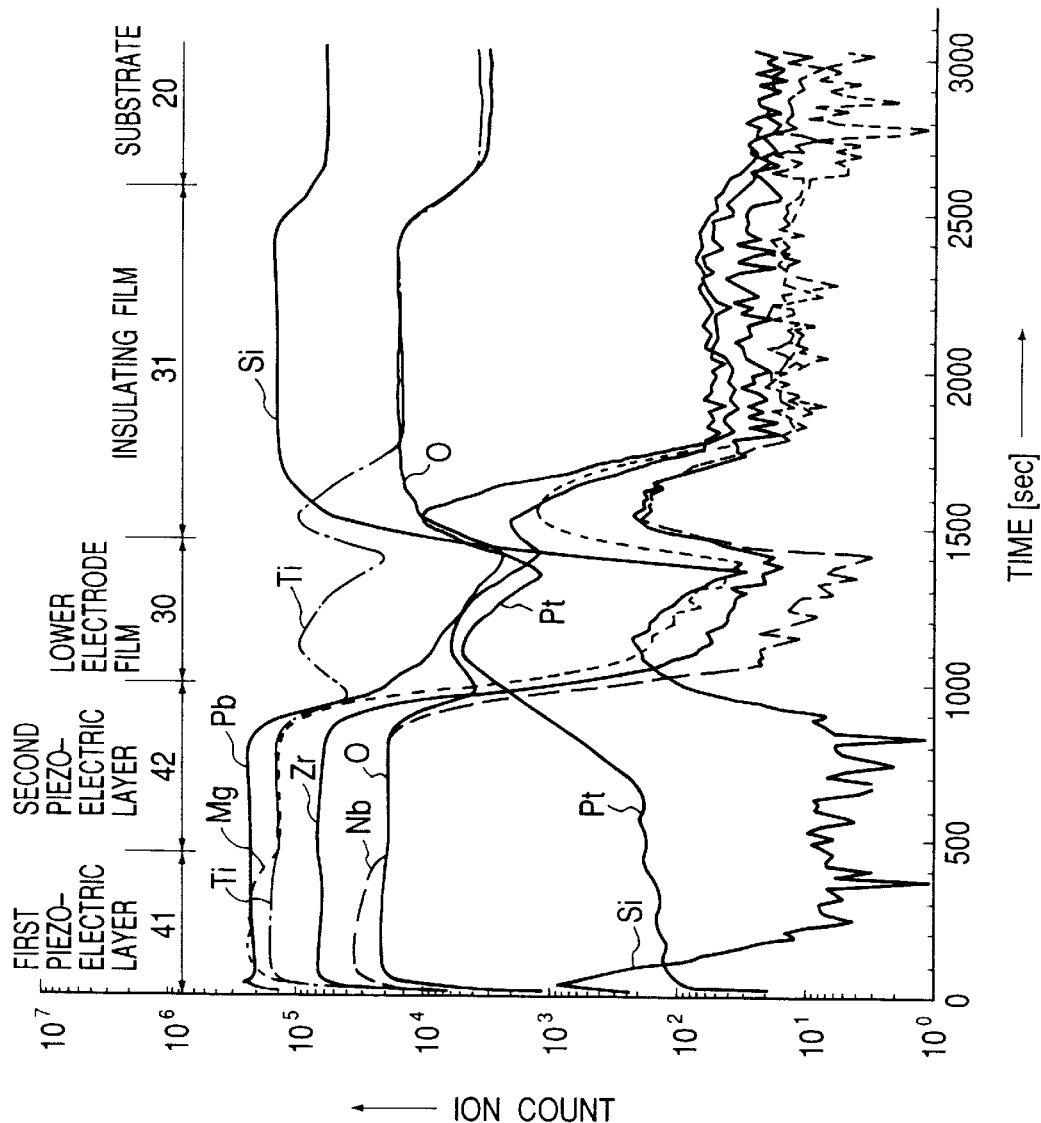
FIG. 7 illustrates a graph for the composition distribution of an ink-jet recording head according to the embodiment of the present invention, with the sputtering period of time along the vertical axis corresponding to the depth from the surface of a piezoelectric layer in the direction of the thickness.

As is shown in FIG. 7, the magnesium Mg content and the niobium Nb content of the first piezoelectric layer are increased compared with those of the second piezoelectric layer. It is understood that ion diffusion was protected and the original compositions of the two piezoelectric layers were maintained. This is because each piezoelectric layer is constituted by four layers. The thickness of the first piezoelectric layer was 500 nm, and the thickness of the second piezoelectric layer was also 500 nm. When the smoothness on the surface was evaluated by an SEM (scanning electron microscope), it was 30 nm to 100 nm.

Table 1 shows the results obtained from the comparison of the piezoelectric constants d, the piezoelectric constants g and the dielectric constants for the ink-jet recording head in this example, for a piezoelectric device that was formed with the same thickness as the ink-jet recording head of this example by using the composition employed for the first piezoelectric layer, and for a piezoelectric device that was formed with the same thickness as the ink-jet recording head of this example by using the composition employed for the second piezoelectric layer. The polarization field strength Ep was measured under the condition where Ep=275 kV/cm.

TABLE 1

| Piezoelectric layer type | Piezoelectric constant d d31 [pC/N] | Piezoelectric constant g g31 [m · mV/N] | Piezoelectric constant E |
|---|---|---|---|
| Embodiment | 185 | 14.0 | 1500 |
| First piezoelectric | 140 | 9.0 | 1800 |
| Second piezoelectric | 120 | 13.5 | 1000 |

Subscript 31 in Table 1 indicates a value in the direction of the thickness of the piezoelectric device. AS is shown in Table 1, compared with the piezoelectric device formed only with the first piezoelectric layer and the piezoelectric device formed only with the second piezoelectric layer, the piezoelectric device in this embodiment, which is constituted by a lamination of the two types of piezoelectric layers, has a comparatively large piezoelectric constant g and dielectric constant, and accordingly, the large piezoelectric constant d is obtained.

EXAMPLE 2

In Example 2 of the present invention, the effect of Mg on the first piezoelectric layer was examined. Table 2 shows the piezoelectric characteristic, as well as the voltage withstandability and the durability, of a piezoelectric device that is formed with a material having the composition shown in equations (1) and (2), instead of the composition used for the first piezoelectric layer in example 1. The piezoelectric characteristic of a piezoelectric device that is formed as a single layer is also shown for the comparison.

TABLE 2

| Piezoelectric device type | Composition (first piezoelectric layer) | Piezo-electric constant d31 [pC/N] | Voltage with stand-ability [V/μm] | Dura-bility |
|---|---|---|---|---|
| Piezoelectric device in Embodiment | $Pb(Zr_{0.56}Ti_{0.44})_{0.8}(Ni_{1/3}Nb_{2/3})_{0.2}O_3$ | 170 | 80 | 1.2 |
| Ordinary piezoelectric device | $Pb(Zr_{0.56}Ti_{0.44})_{0.8}(Mg_{1/3}Nb_{2/3})_{0.2}O_3$ | 150 | 70 | 1.0 |

As is apparent from Table 2, when Mg is not present in the first piezoelectric layer, the piezoelectric characteristic d of the total device is increased and the voltage withstandability and the durability are also superior.

According to Embodiment 1, a large piezoelectric constant d can be obtained by laminating a plurality of types of piezoelectric layers, and a piezoelectric device can be produced that can be displaced more than in the conventional case upon the application of the same voltage. Therefore, an ink-jet recording head can be provided that, upon the application of the same voltage, can eject a larger quantity of ink droplets at a higher speed than is possible in the conventional case.

Since each ceramic layer of the piezoelectric layer is crystallized, a diffusion phenomenon can be prevented, even for an amorphous ceramic material, and a layer structure that can maintain a large piezoelectric constant d can be provided.

The dielectric constant of the piezoelectric device as a whole can be increased by using a specific composition for one of piezoelectric layers. Especially when a composition that does not include Mg is employed for a piezoelectric layer, a piezoelectric device can be provided that has superior voltage withstandability, as well as a large piezoelectric constant d.

EMBODIMENT 2

While the thicknesses of the first and the second piezoelectric layers are the same in Embodiment 1, in Embodiment 2 a new application is provided by changing the thicknesses of the two.

Since a piezoelectric device according to Embodiment 2 is employed for an ink-jet printer (see FIG. 2) and an ink-jet recording head (see FIGS. 3 and 4) as in Embodiment 1, no explanation for it will be given.

Figure 8:
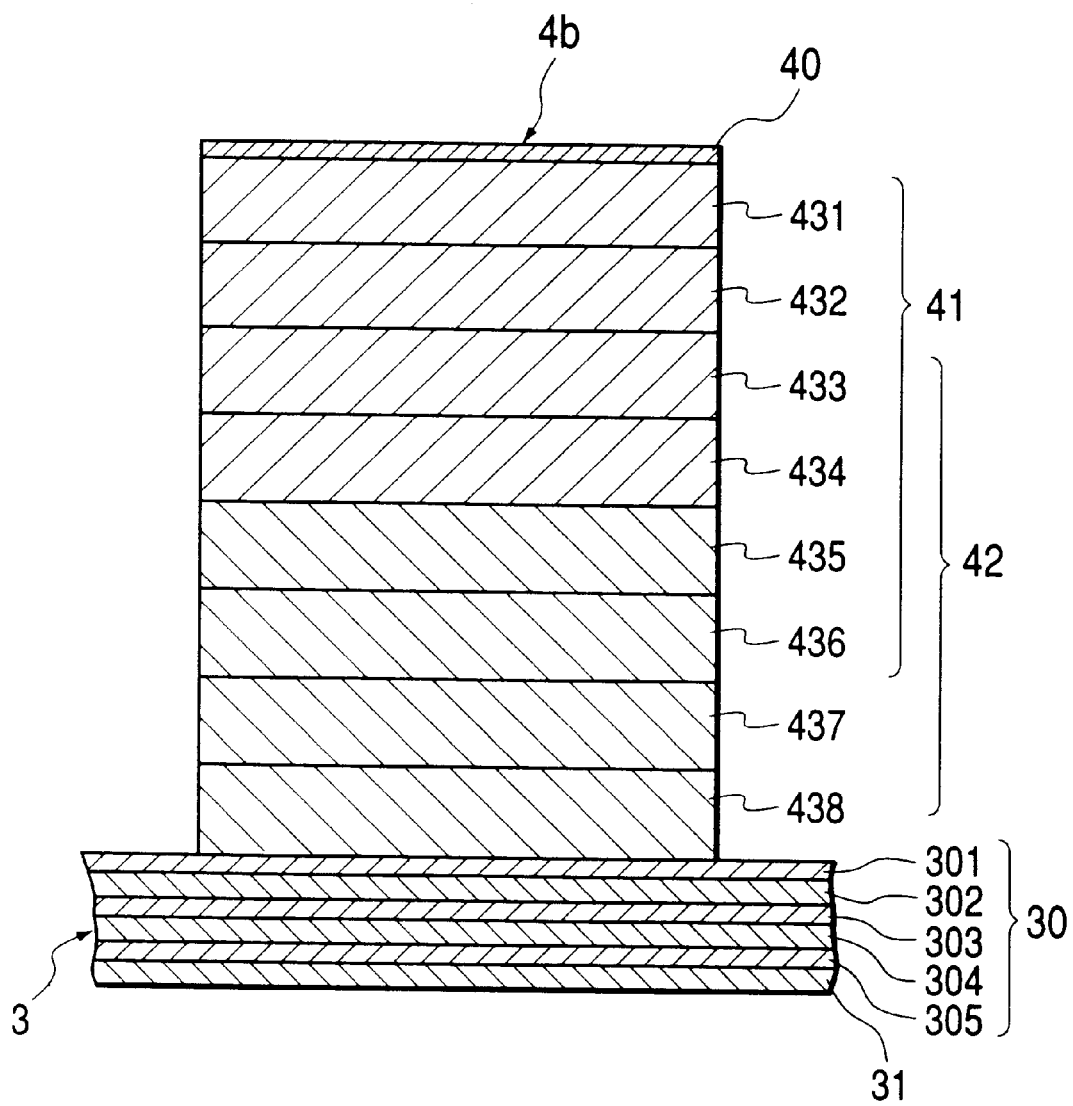
FIG. 8 illustrates a cross-sectional view for explaining the layer structure of a piezoelectric device according to Embodiment 2, as viewed at a cross section taken along A—A in FIG. 4.

The layer structure of the piezoelectric device 4b in this embodiment (cross section taken along A—A in FIG. 4) includes an upper electrode film 40 and ceramic layers 431 and 438, as is shown in FIG. 8.

The upper electrode film 40, which is one of the electrodes provided to apply a voltage to the piezoelectric layer, is formed of a conductive layer, such as a 0.1 μm thick platinum (Pt), as in Embodiment 1.

The ceramic layers 431 to 438 are sorted into a first piezoelectric layer 41 and a second piezoelectric layer 42, as in Embodiment 1. However, the boundary between the two layers is arbitrarily changed from between the second layer 432 and the third layer 433 to between the sixth layer 436 and the seventh layer 437. The thickness of each ceramic layer is 125 nm, as in Embodiment 1.

The ceramic layers allocated for the first piezoelectric layer 41 have a piezoelectric ceramic composition that has a comparatively high dielectric constant, and the same composition as in Embodiment 1 can be employed. An example composition for the first piezoelectric layer is $Pb(Zr_{0.56}Ti_{0.44})_{0.8}(Mg_{1/3}Nb_{2/3})_{0.2}O_3$.

The ceramic layers allocated for the second piezoelectric layer 42 have a piezoelectric ceramic composition that has a comparatively small dielectric constant and a comparatively high piezoelectric constant g, and the same composition as in Embodiment 1 can be employed. An example composition for the second piezoelectric layer is $PbZr_{0.56}Ti_{0.44}O_3$.

For the same reason as in Embodiment 1, it is preferable that a crystal nucleus exist in at least the layer that contacts a lower electrode film in order to form a piezoelectric device having a satisfactory crystal structure.

A vibration plate film 3 is constituted by a lower electrode film 30 and an insulating film 31, and since the specific structure is the same as that in Embodiment 1, no further explanation for it will be given.

The first piezoelectric layer 41 and the second piezoelectric layer 42 may be laminated in the reverse order. That is, the first piezoelectric layer 41 may be formed on the lower electrode film 30, the second piezoelectric layer 42 be formed thereon, and finally an upper electrode film 40 be formed atop the two.

The method used for manufacturing a piezoelectric device in Embodiment 2 is substantially the same as that in Embodiment 1, except as regards the number of laminated layers in each piezoelectric layer. Specifically, at the vibration plate film step (FIG. 6(a)), the insulating film 31 and the lower electrode film 30, which serve as the vibration plate film 3, are formed on a silicon substrate 20, and the second piezoelectric layer 42 is formed at the second piezoelectric layer formation step (FIG. 6(b) and (c)). At this time, the number of ceramic layers to be laminated is changed, as needed. The number of ceramic layers to be laminated is adjusted by changing the ratio of the thicknesses of the two piezoelectric layers so that the entire piezoelectric device has a desired piezoelectric constant g, or a desired dielectric constant. Specifically, when the first piezoelectric layer has the piezoelectric constant g1 and the second piezoelectric layer has the piezoelectric constant g2 (g2>g1), the ratio of the thicknesses of the two piezoelectric layers is adjusted to obtain a desired piezoelectric constant g (g2>g>g1). Further, when the first piezoelectric layer has the dielectric constant ∈1 and the second piezoelectric layer has the dielectric constant ∈2 (∈1>∈2), the number of the ceramic layers in each piezoelectric layer is adjusted to obtain a desired dielectric constant ∈ (∈1>∈>∈2). Of course, the ratio of the thicknesses of the first and the second piezoelectric layers can be adjusted by changing the thicknesses of the ceramic layers. The total number of ceramic layers in the first and the second piezoelectric layers should not exceed 12 because when too many layers are laminated, the drive voltage must be increased.

The individual ceramic layers are formed applying a coat of the above described piezoelectric ceramic material at the coating step (FIG. 6(b)), and by drying and pyrolyzing the thus applied ceramic layers at the drying and degreasing step (FIG. 6(c)). After a plurality of layers have been laminated, the rapid thermal annealing process is performed in the same manner. The timing for the performance of the rapid thermal annealing process is determined in consonance with the number of laminated layers in a piezoelectric layer. The first rapid thermal annealing process is performed when half of the ceramic layers have been laminated. For the first rapid thermal annealing process, in an oxygen atmosphere the ceramic layers are heated for five minutes at 600° C. and then for one minute at 725° C.

Following this, the first piezoelectric layer 41 is formed on the second piezoelectric layer 42 at the first ceramic layer formation step (FIG. 6(d) and (e)). The ceramic layers of the first piezoelectric layer are formed by applying a coat of the piezoelectric ceramic material and by drying and degreasing it, in the same manner as for the second piezoelectric layer. When all the ceramic layers have been laminated, the final rapid thermal annealing process is performed one time. In this process, in an oxygen atmosphere the ceramic layers are heated, for example, for five minutes at 650° C. and then for one minute at 900° C. Then, the upper electrode film 20 is formed on the first piezoelectric layer 41 at the upper electrode formation step (FIG. 6(f)).

Figure 6:
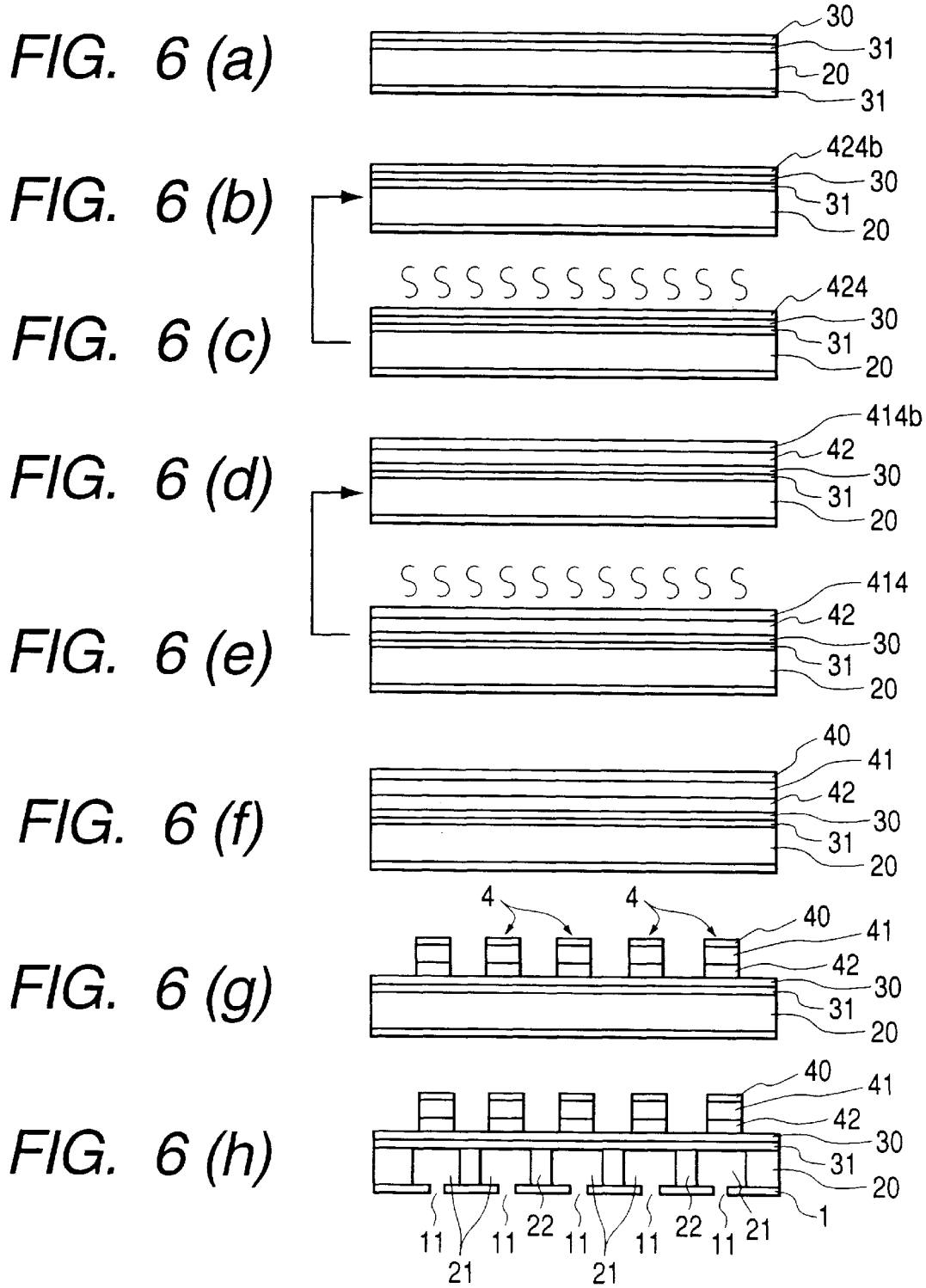
FIGS. 6(a)–6(h) illustrate cross-sectional views of a structure formed during a method for manufacturing an ink-jet recording head according to the present invention.

As in Embodiment 1, the layer portions, except for the portions that are to be retained as piezoelectric devices, are removed at the etching step (FIG. 6(g)), so that the shapes of the piezoelectric devices correspond to those of the cavities. By following the above described steps, the piezoelectric device 4b can be completed. Thereafter, at the pressure chamber formation and nozzle plate installment step (FIG. 6 (h)), cavities 21 are formed in the other face of the pressure chamber substrate 2, which is then bonded to a nozzle plate.

According to the present invention, when the two piezoelectric layers are laminated, the piezoelectric constant g and the dielectric constant of the layer lamination are values lying midway between the values for the piezoelectric constants g and the values for the dielectric constants of the individual layers. Since the piezoelectric constant g and the dielectric constant of the layer lamination are changed in accordance with the ratio of the thicknesses of the two layers, the thicknesses of the two piezoelectric layers can be changed to obtain a desired piezoelectric constant g and a desired dielectric constant.

Why the piezoelectric constant g is a value lying midway between the values of the piezoelectric constants g of the two layers can be understood from the observation at the atomic structure level, as in Embodiment 1. Since the dielectric constant for the entire piezoelectric device is changed depending on the ratio of the thicknesses of the two layers, the thicknesses of the two layers can be changed in order to obtain a desired dielectric constant. And when there is a limit imposed for the value of the piezoelectric constant g or of the dielectric constant of the piezoelectric device, the number of layers to be laminated can be changed in accordance with the limit value, so that a piezoelectric device can be provided for which the piezoelectric constant d is increased, and either the piezoelectric constant g or the dielectric constant is reduced. Since it is preferable that a circuit current be reduced, for example, for an actuator that reads a signal from a compact disk, the dielectric constant must be reduced for a piezoelectric device for such an actuator. In this case, the dielectric constant of a piezoelectric device that provides a desired circuit current need only be calculated so as to constitute a piezoelectric device that has a dielectric constant that is equal to or lower than the obtained dielectric constant.

When one piezoelectric layer is to have an effect on the other piezoelectric layer, sufficient stress must occur in one piezoelectric layer to enable a change in the distance between the crystal lattices of that piezoelectric layer to effect a change in the distance between the lattices of the other piezoelectric layer. Therefore, if the ceramic layers having a thickness of 125 nm are laminated, the first and the second piezoelectric layers 41 and 42 must be designed to be equivalent to the thickness of two-layers, i.e., about 250 nm.

As an example for Embodiment 2, Table 3 shows piezoelectric constant $d_{31}$ (piezoelectric characteristic d in the direction of the depth), piezoelectric constant $g_{31}$ (piezoelectric characteristic g in the direction of the depth), and a dielectric constant obtained when the numbers of layers were changed for the first piezoelectric layer and for the second piezoelectric layer of a piezoelectric device that includes the total eight layers. The same composition as in Example 1 in Embodiment 1 was employed. The polarization field strength Ep was measured under the condition where Ep=275 kV/cm.

TABLE 3

| First piezoelectric layer count | Second piezoelectric layer count | Piezoelectric constant d d31 [pC/N] | Piezoelectric constant j g31 [m · mV/N] | Piezoelectric constant e |
| --- | --- | --- | --- | --- |
| 2 | 6 | 175 | 15.2 | 1300 |
| 3 | 5 | 175 | 14.5 | 1370 |
| 4 | 4 | 180 | 14.0 | 1450 |
| 5 | 3 | 180 | 13.5 | 1530 |
| 6 | 2 | 185 | 13.0 | 1620 |

As is apparent from Table 3, when the number of layers and their thicknesses in the first piezoelectric layer are reduced, a high piezoelectric characteristic $d_{31}$ can be maintained while the dielectric constant can be lowered.

As is described above, the effects obtained in Embodiment 1 are also acquired in Embodiment 2. The thicknesses of the first and the second piezoelectric layers are changed so that the dielectric constant and the piezoelectric constant g can be restricted to desired values, and so that a large piezoelectric constant d can be maintained for a piezoelectric device.

EMBODIMENT 3

In Embodiment 3 only one layer is provided for each of the first piezoelectric layer and the second piezoelectric layer in above described embodiments, and a further, third piezoelectric layer is formed to provide a variation of the above layer structure.

Figure 9:
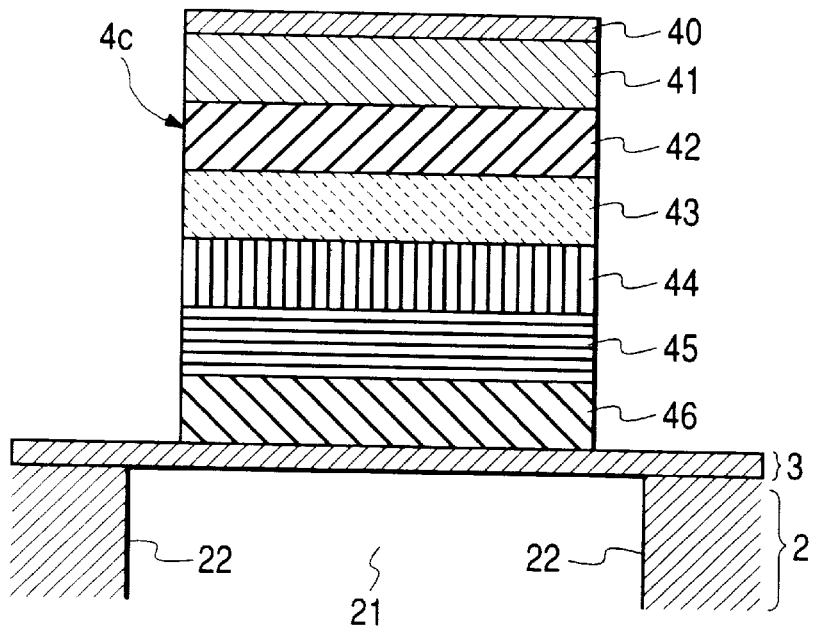
FIG. 9 illustrates a cross-sectional view for explaining the layer structure of a piezoelectric device according to Embodiment 3, as viewed at a cross section taken along A—A in FIG. 4.

FIG. 9 is a cross-sectional view of a piezoelectric device 4c according to this embodiment. In this cross-sectional view, the piezoelectric device 4c, including a vibration plate 3 and a pressure chamber substrate 2, is cut in the direction of the width. Since an ink-jet printer (see FIG. 2) and an ink-jet recording head (see FIGS. 3 and 4), for which the piezoelectric device 4c is to be used, is the same as those in Embodiment 1, no explanation for them will be given.

The piezoelectric device in Embodiment 3 includes three or more types of piezoelectric layers. In this embodiment, the piezoelectric layer that has the largest dielectric constant of the three is called a first piezoelectric layer, and the piezoelectric layer that has the largest piezoelectric constant g is called a second piezoelectric layer, and the other piezoelectric layers being generally called third piezoelectric layers. Therefore, the third piezoelectric layers can consist of a plurality of types of layers.

As is shown in FIG. 9, in the layer structure (cross section taken along A—A in FIG. 4) of the piezoelectric device $4c$ in this embodiment, three or more types (six types in FIG. 9) of piezoelectric layers 41 to 46 are located between an upper electrode film 40 and a vibration plate 3.

Since the upper electrode film 40, the vibration plate 3 and the pressure chamber substrate 2 are the same as those in Embodiment 1, no explanation for them will be given.

The piezoelectric layers 41 to 46 have different compositions. For them, the compositions employed for the first and the second piezoelectric layers specifically explained in Embodiment 1 are employed. Assume that a layer denoted by 41, the same numeral as in Embodiment 1, is a first piezoelectric layer, and a layer denoted by numeral 42 is a second piezoelectric layer. The other layers, i.e., the third piezoelectric layers 43 to 46, are laminated in order to increase the dielectric constant, to increase the piezoelectric constant g, or for another purpose, such as the reduction of the internal stress of the piezoelectric layer. Specifically, the composition represented by equation (1) or (2) in Embodiment 1 is used for the first piezoelectric layer 41, PZT is used for the second piezoelectric layer 42, and a mixture of the compositions represented by equations (1) and (2) is used for the third piezoelectric layers 43 to 46. The composition obtained by, for example, changing metal elements b and b' in equations (1) and (2) is employed for each of the third piezoelectric layers 43 to 46.

It is preferable that each of the piezoelectric layers 41 to 46 be constituted by laminating a plurality of ceramic layers based on the same idea, as in Embodiment 1. This is because when a thick layer is formed, a crack occurs and a layer having a satisfactory crystal structure can not be formed. For the same reason as in Embodiment 1, it is preferable that a crystal nucleus exist in at least the layer that contacts the lower electrode film in order to form a piezoelectric device having a satisfactory crystal structure.

The order for the layer lamination is not limited to that shown in FIG. 9, and can be variously changed. For example, the number of third piezoelectric layers 43 to 46 is not limited to four; an arbitrary number of layers (43 to $4n$ (n is a natural numbers) can be formed. In addition, the first and the second piezoelectric layers 41 and 42 need not contact each other. Further, the thicknesses of the individual piezoelectric layers and the number of laminated ceramic layers need not be the same, and can be variously altered in consonance with the objects of the individual layers. For example, when the dielectric constant is to strongly affect the entire structure, the thickness of the first piezoelectric layer 41 and the number of laminated ceramic layers are increased. When the piezoelectric constant g is to greatly effect the entire structure, the thickness of the second piezoelectric layer 42 and the number of laminated ceramic layers are increased.

Since, for the same reason as in Embodiment 1, the thus structured piezoelectric device $4c$ has a large dielectric constant and a large piezoelectric constant g, the piezoelectric constant d can be increased. Specifically, when the dielectric constants of the piezoelectric layers 41 to $4n$ are $\in_1$ to $\in_n$, $\in_1 > \in_2$, $\in_3$, $\in_n$ and when the piezoelectric constants g of the piezoelectric layers 41 to 4n are $g_1$ $g_4$ $g_n$, $g_2 > g_1$ and $g_3$ to $g_n$. And when the piezoelectric layers having these dielectric constants and piezoelectric constants g are laminated, the piezoelectric constant d in the direction of the thickness of the piezoelectric device is represented as $d = g \times \in \times \in_0$, i.e., the above equation (3). The smallest constant among $g_1$ and $g_3$ to $g_n < g \leq g_2$, and the smallest constant among $\in_2$ to $\in_n < \in \leq \in_1$, where $\in_0$ is a dielectric constant in vacuum ($= 8.85 \times 10^{-12}$ [F/m]). If the large dielectric constants of the piezoelectric layers are set, even though one piezoelectric layer has a low dielectric constant the dielectric constant of the entire piezoelectric device can be increased. The effect of the dielectric layer is greater when the thicker layer is formed, as is described above. Similarly, if the large piezoelectric constants g of the piezoelectric layers are set, even though one piezoelectric layer has a low piezoelectric constant g the dielectric constant g of the entire piezoelectric device can be increased. In order to increase the dielectric constant and the piezoelectric constant g, only the thicknesses of the piezoelectric layers that have large dielectric constants and piezoelectric constants g and the number of ceramic layers need be increased.

As is described above, according to Embodiment 3, provided is a piezoelectric device that has three or more types of piezoelectric layers and with which the same effects can be acquired as in Embodiment 1. The layer structure in this embodiment can be applied especially when layers are to be laminated that have low dielectric constants and piezoelectric constants g but possess other advantages.

EMBODIMENT 4

While piezoelectric layers that differ from each other are laminated in the above described embodiments, in this embodiment a variation of the layer structure is provided that includes a plurality of first piezoelectric layers and a plurality of second piezoelectric layers.

(Explanation of layer structure)

Figure 10:
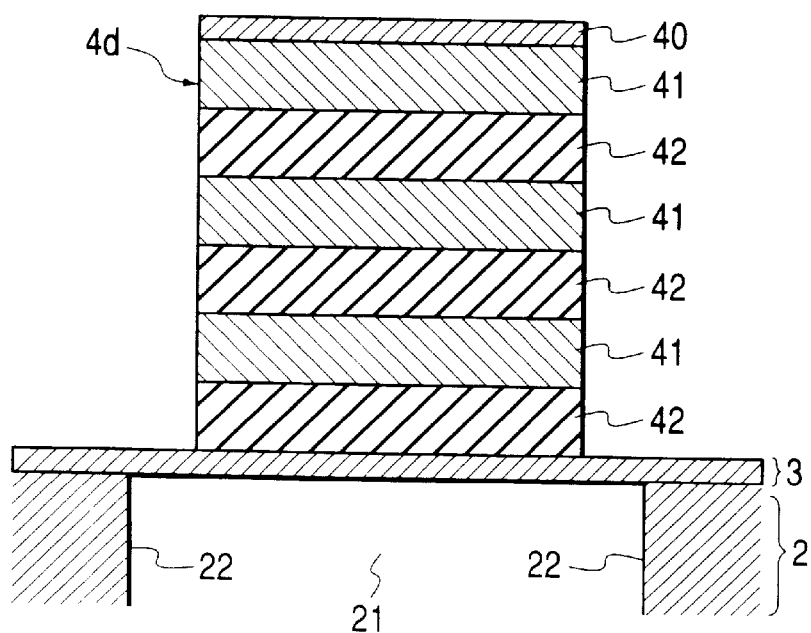
FIG. 10 illustrates a cross-sectional view for explaining the layer structure of a piezoelectric device according to Embodiment 4, as viewed at a cross section taken along A—A in FIG. 4.

FIG. 10 is a cross-sectional view of a piezoelectric device according to this embodiment. In this cross-sectional view, the piezoelectric device $4d$, including a vibration plate 3 and a pressure chamber substrate 2, is cut in the direction of the width. An ink-jet printer (see FIG. 2) and an ink-jet recording head (see FIGS. 3 and 4), for which the piezoelectric device $4d$ is employed, have the same structure as in Embodiment 1, and no explanation for them will be given.

As is shown in FIG. 10, the piezoelectric device $4d$ (cross section taken along A—A in FIG. 4) in Embodiment 4 is formed by alternately laminating the first piezoelectric layer 41 and the second piezoelectric layer 42 in Embodiment 1 a plurality of times. Since its specific composition is the same as that in Embodiment 1, no explanation for it will be given.

It is preferable that the piezoelectric layers 41 and 42 be formed by laminating a plurality of ceramic layers, based on the same idea as that in Embodiment 1. This is because when a thick layer is formed, a crack occurs and a layer having a satisfactory crystal structure can not be formed. For the same reason as in Embodiment 1, it is preferable that a crystal nucleus be present at least in a layer that contacts the lower electrode film in order to form a piezoelectric device having a satisfactory crystal structure.

The order for the lamination is not limited to that shown in FIG. 10, and can be variously changed. For example, the positions of the first piezoelectric layer 41 and the second piezoelectric layer 42 may be reversed. Further, neither the thicknesses of the individual piezoelectric layers nor the number of laminated ceramic layers need be the same; they can be variously altered as needed. For example, when the dielectric constant is to strongly affect the entire structure, the thickness of the first piezoelectric layer 41 and the number of laminated ceramic layers are increased. When the piezoelectric constant g is to greatly affect the entire structure, the thickness of the second piezoelectric layer 42 and the number of laminated ceramic layers are increased.

Since, for the same reason as in Embodiment 1, the thus structured piezoelectric device 4d has a large dielectric constant and a large piezoelectric constant g, the piezoelectric constant d can be increased. The dielectric constants of the individual piezoelectric layers are the same as the dielectric constant of a piezoelectric layer that has a thickness equivalent to the total thickness of the individual piezoelectric layers. This is because, since the piezoelectric device is a series connection of capacitors, even when their positions are changed, the dielectric constant of the piezoelectric device is not altered. That is, so long as the first piezoelectric layer laminate is as thick as the first piezoelectric layer in Embodiment 1, the effect of the dielectric constant relative to the piezoelectric device is unchanged. The piezoelectric constant g can be larger than that in Embodiment 1. As is described above, since the stress in the second piezoelectric layer, which has a larger piezoelectric constant g, affects the crystal structure of the first piezoelectric layer, which has a smaller piezoelectric constant g, in this embodiment the piezoelectric constant g of the entire piezoelectric device is increased. Since it is considered that the effect of the stress becomes greater as the distance from the surface of the second piezoelectric layer is reduced, the mechanical effect imposed on the first piezoelectric layer is greater when the second piezoelectric layers are located separately, as is shown in FIG. 10.

As is described above, according to Embodiment 4, provided is a piezoelectric device that is formed by alternately laminating the first and the second piezoelectric layers and that can provide the same effect as that in Embodiment 1. Especially in this embodiment, the effect of the piezoelectric constant g can be increased.

EMBODIMENT 5

While in Embodiment 4 the first and the second piezoelectric layers are alternately laminated, in Embodiment 5 is provided a variation of the layer structure, such as a alternate lamination structure using the third piezoelectric layer explained in Embodiment 3.

Figure 11:
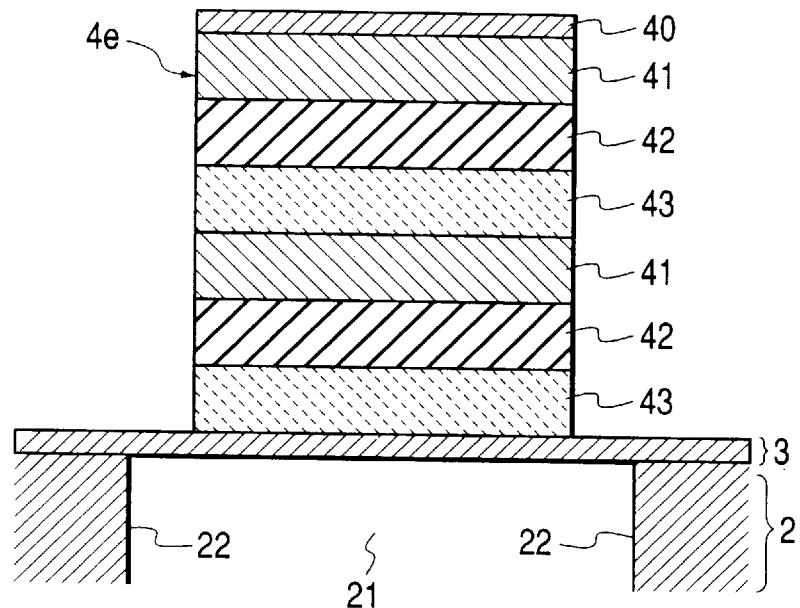
FIG. 11 illustrates a cross-sectional view for explaining the layer structure of a piezoelectric device according to Embodiment 5, as viewed at a cross section taken along A—A in FIG. 4.

FIG. 11 is a cross-sectional view of a piezoelectric device 4e according to this embodiment. In this cross-sectional view, the piezoelectric device, including a vibration plate 3 and a pressure chamber substrate 2, is cut in the direction of the width. An ink-jet printer (see FIG. 2) and an ink-jet recording head (see FIGS. 3 and 4), for which the piezoelectric device 4e is employed, have the same structure as in Embodiment 1, and no explanation for them will be given.

As is shown in FIG. 11, the piezoelectric device 4e in Embodiment 5 (cross section taken along A—A in FIG. 4) is constructed by laminating, a plurality of times, a layer structure that includes the first piezoelectric layer 41 and the second piezoelectric layer 42 in Embodiment 4, and the third piezoelectric layer 43 in Embodiment 3. Although only one type of third piezoelectric layer 43 is shown in FIG. 11, a plurality of types of third piezoelectric layers 43 to 4n (n is a natural number) may be repeated as explained in FIG. 9. Since specific compositions are the same as those in Embodiments 1 and 3, no explanation for them will be given.

It is preferable that the piezoelectric layers 41 to 43 be formed by laminating a plurality of ceramic layers, based on the same idea as in Embodiment 1. This is because when a thick layer is formed, a crack occurs and a layer having a satisfactory crystal structure can not be formed. Further, for the same reason as in Embodiment 1, it is preferable that a crystal nucleus be present at least in the layer that contacts the lower electrode film in order to form a piezoelectric device having a satisfactory crystal structure.

Figure 12:
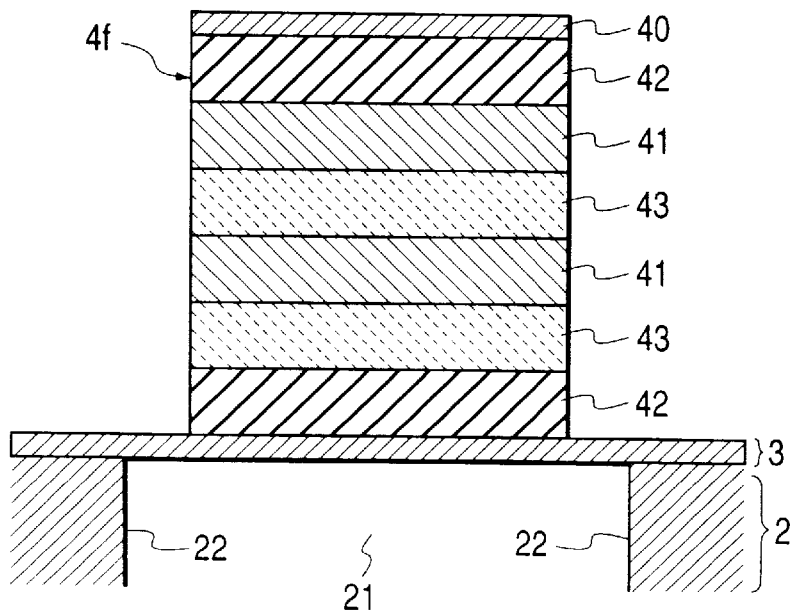
FIG. 12 illustrates a cross-sectional view for explaining a modification of the layer structure of a piezoelectric device according to Embodiment 5, as viewed at a cross section taken along A—A in FIG. 4.

The order for the layer lamination is not limited to that shown in FIG. 11, and can be variously changed. For example the relative positions of two of the first, the second and the third piezoelectric layers 41, 42 and 43 may be reversed. Further, as is shown in FIG. 12, a piezoelectric device 4f wherein the order in which the piezoelectric layers 41, 42 and 43 are laminated irregularly may be employed. Also the number of piezoelectric layers of a specific type may differ from the numbers of the other types of piezoelectric layers. And neither the thicknesses of the individual piezoelectric layers nor the number of laminated ceramic layers need be the same; they can be variously altered as needed. For example, when the dielectric constant is to strongly affect the entire structure, the number of first piezoelectric layers 41, the thickness of each layer and the number of laminated ceramic layers are increased. When the piezoelectric constant g is to greatly affect the entire structure, the number of second piezoelectric layers 42, the thickness of each layer and the number of laminated ceramic layers are increased.

Since, for the same reason as in Embodiment 1, the thus structured piezoelectric devices 4e and 4f have a large dielectric constant and a large piezoelectric constant g, their piezoelectric constants d can be increased. Therefore, if the large dielectric constants of the piezoelectric layers are set, even though one piezoelectric layer has a low dielectric constant the dielectric constant of the entire piezoelectric device can be increased. The effect of the dielectric layer is greater when a thicker layer is formed, as is described above. Similarly, if the large piezoelectric constants g of the piezoelectric layers are set, even though one piezoelectric layer has a low piezoelectric constant g the dielectric constant g of the entire piezoelectric device can be increased. In order to increase the dielectric constant and the piezoelectric constant g, only the number of piezoelectric layers that have large dielectric constants and large piezoelectric constants g, the thickness of each layer, and the number of ceramic layers need be increased. Particularly, the same action as in Embodiment 4 affects on the piezoelectric constant g, which can provide mechanical effects for the first piezoelectric layer.

As is described above, according to Embodiment 5, a piezoelectric device is provided wherein one or more of piezoelectric layers of three or more types are laminated at arbitrary locations to acquire the same effect as that in the above described embodiments. Especially when a plurality of types of piezoelectric layers are to be arranged in consonance with their functions to form a thick piezoelectric device, the piezoelectric characteristic of the piezoelectric device can be adjusted by employing the functions of the individual piezoelectric layers and the idea incorporated in this embodiment.

In addition to the examples incorporated in the above described embodiments, various other modifications of the present invention are possible. The layer structures in the embodiments are also merely examples, and various other layer structures can be devised. Specifically, when a piezoelectric device is constituted by a plurality of compositions, and when an arrangement includes a layer having a large dielectric constant and a layer having a high piezoelectric constant g, a piezoelectric device can be provided that has the same effect as is obtained in the embodiments. The compositions employed for the piezoelectric device is not limited to the examples in the embodiments, and various compositions that provide a large dielectric constant or a large piezoelectric constant g can be applied.

The shape and arrangement of a piezoelectric device, and the structures of the vibration plate and the pressure chamber substrate can be variously modified. These do not directly affect the subject of the present invention.

While a piezoelectric device for an ink-jet recording head is employed for the present invention, the piezoelectric layer formed in this invention may be used as a piezoelectric device that is sandwiched by two electrode films. In other words, when the piezoelectric layers in the above embodiments are laminated and cut in a shape corresponding to a required size of an object, a piezoelectric device having a high performance can be obtained. Since the piezoelectric layers of the present invention have a large piezoelectric constant d, compared with the conventional piezoelectric device, the piezoelectric device of the present invention generates a large electric charge upon the application of the same pressure, and can be displaced further upon the application of the same voltage. The objects for which such a piezoelectric device may be employed can be a filter, a delay line, a lead selector, a fork oscillator, a fork timer, a transceiver, a piezoelectric pickup, a piezoelectric earphone, a piezoelectric microphone, an SAW filter, an RF modulator, a resonator, a delay device, a multi-strip coupler, a piezoelectric accelerometer, and a piezoelectric loudspeaker.

Since an ink-jet recording head according to the present invention has a laminated structure consisting of piezoelectric ceramic layers having different characteristics, such a piezoelectric device can have larger piezoelectric constant d than has a conventional one, and more ink droplets can be ejected and at a higher speed while using a lower voltage.

Since the method of the present invention for manufacturing an ink-jet recording head has a step of laminating piezoelectric ceramic layers having different characteristics, a piezoelectric device can have a larger piezoelectric constant d than has a conventional one, and more ink droplets can be ejected at higher speed while using a lower voltage.

Since a piezoelectric device according to the present invention has a laminated structure composed of piezoelectric ceramic layers having different characteristics, it can have a larger piezoelectric constant d than has a conventional one, and its electric-mechanical conversion characteristic can be enhanced. For example, a greater volume expansion and reduction occurs at a lower voltage, and the same voltage as in the conventional case can be generated using less power.

What is claimed is:

1. An ink-jet recording head with nozzles comprising:
   a pressure chamber formed in the head, said pressure chamber communicating with the nozzles; and
   a piezoelectric device formed on one of the walls of said pressure chamber, said piezoelectric device being operative to change the volume of said pressure chamber by application of a voltage, said piezoelectric device comprising a first piezoelectric layer having a first dielectric constant $\in 1$ and a first piezoelectric constant g1, and a second piezoelectric layer having a second dielectric constant $\in 2$ and a second piezoelectric constant g2,
   wherein the first dielectric constant $\in 1$ is greater than the second dielectric constant $\in 2$, and the second piezoelectric constant g2 is greater than the first piezoelectric constant g1.

2. An ink-jet recording head according to claim 1, wherein said first piezoelectric layer is formed by laminating a plurality of first layers each having the same composition, and said second piezoelectric layer is formed by laminating a plurality of second layers each having the same composition.

3. An ink-jet recording head according to claim 2, wherein said plurality of first layers and said plurality of second layers comprise between 2 and 6 layers, inclusive.

4. An ink-jet recording head according to claim 1, wherein said first piezoelectric layer is perovskite crystal, which has a composition represented by the general formula:

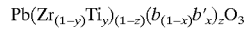

where b and b' denote divalent to hexavalent metal elements, and where element b has n valences (n is a natural number), b' has m valences, x is a real number of 0<x<1, y is a real number of 0<y<1, and z is a real number of 0<z<1, with n, m and x satisfying the equation $$n(1-x)+mx=4.$$

5. An ink-jet recording head according to claim 4, wherein said divalent to hexavalent metal elements b and b' consist of two of the following elements: Mg, Sc, Cr, Mn, Fe, Co, Ni, Zn, Nb, Cd, In, Sn, Sb, La, Yb, Lu, Ta, W and Bi.

6. An ink-jet recording head according to claim 1, wherein said first piezoelectric layer has a composition of $Pb(Zr_{0.56}Ti_{0.44})_{0.8}(Mg_{1/3}Nb_{2/3})_{0.2}O_3$.

7. An ink-jet recording head according to claim 1, wherein said second piezoelectric layer is a piezoelectric ceramic containing elements of Pb, Zr and Ti.

8. An ink-jet recording head according to claim 1, wherein said second piezoelectric layer has a composition of $PbZr_{0.56}Ti_{0.44}O_3$.

9. An ink-jet recording head according to claim 1, wherein, a ratio of the thickness of said first piezoelectric layer to the thickness of said second piezoelectric layer is so adjusted as to obtain a desired piezoelectric constant g where g2>g for said piezoelectric devices >g1.

10. An ink-jet recording head according to claim 1, wherein, a ratio of the thickness of said first piezoelectric layer to the thickness of said second piezoelectric layer is so adjusted as to obtain a desired dielectric constant $\in$ for said piezoelectric device, where $\in 1 > \in > \in 2$.

11. An ink-jet recording head according to claim 1, further comprising: a third piezoelectric layer that comprises at least one type of layer and that has a different composition from that of said first and said second piezoelectric layers.

12. An ink-jet recording head according to claim 11, wherein said third piezoelectric layer is formed by combining said compositions of said first and said second piezoelectric layers.

13. An ink-jet recording head according to claim 11, further comprising a plurality of said first, said second and said third piezoelectric layers, wherein said first, said second and said third piezoelectric layers are laminated in a predetermined order.

14. An ink-jet recording head according to claim 11, further comprising one or more of said first, said second and said third piezoelectric layers, wherein said first, said second, and said third piezoelectric layers are repeatedly laminated in an irregular order.

15. An ink-jet recording head according to claim 11, wherein said specific dielectric value is no less than 1400 and said specific piezoelectric constant is no less than $13 \times 10^{-3}$ m.V/N layers.

16. An ink-jet recording head according to claim 11, wherein each of said first, second and third piezoelectric layers is formed by laminating a plurality of ceramic layers and wherein said plurality comprises between 2 and 6 layers, inclusive.

17. An ink-jet recording head according to claim 1, further comprising a plurality of said first and said second piezoelectric layers, wherein said first and said second piezoelectric layers are alternately laminated.

18. An ink-jet recording head according to claim 17, wherein said first and said second piezoelectric layers comprise plurality of ceramic layers.

19. An ink-jet recording head according to claim 1, wherein said piezoelectric device further comprises an upper electrode and a lower electrode, said lower electrode serving as a base for crystal growth, and wherein a piezoelectric layer that is closely attached to said lower electrode has a crystal particle that serves as the nucleus for said crystal growth.

20. An ink-jet recording head according to claim 1, wherein said specific dielectric value is no less than 1400 and said specific piezoelectric constant is no less than $13 \times 10^{-3}$ m.V/N layers.

21. An ink-jet recording head according to claim 1, wherein said first piezoelectric layer and said second piezoelectric layer comprise a plurality of ceramic layers.

22. An ink-jet recording head according to claim 21, wherein the boundary between said first and said second piezoelectric layers is changed between any one of said plurality of ceramic layer.

* * * * *